(12) United States Patent
Kizilyalli et al.

(10) Patent No.: US 7,605,064 B2
(45) Date of Patent: Oct. 20, 2009

(54) SELECTIVE LASER ANNEALING OF SEMICONDUCTOR MATERIAL

(75) Inventors: Isik C. Kizilyalli, Millburn, NJ (US); Joseph Rudolph Radosevich, Orlando, FL (US); Pradip Kumar Roy, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 130 days.

(21) Appl. No.: 11/438,493

(22) Filed: May 22, 2006

(65) Prior Publication Data

US 2007/0001243 A1 Jan. 4, 2007

Related U.S. Application Data

(62) Division of application No. 09/516,004, filed on Feb. 29, 2000, now abandoned.

(51) Int. Cl.
H01L 21/22 (2006.01)
H01L 21/38 (2006.01)

(52) U.S. Cl. .................. 438/542; 438/535; 438/554; 257/E21.135; 257/E21.466

(58) Field of Classification Search ............. 438/585, 438/542, 554, 535, 637, 638; 257/E21.579, 257/E21.135, E21.466
See application file for complete search history.

(56) References Cited

U.S. PATENT DOCUMENTS 3,841,917 A * 10/1974 Shannon .................. 438/186

(Continued)

FOREIGN PATENT DOCUMENTS

GB 2 133 618 A 7/1984

JP 3-74878 3/1991
JP 4-250617 9/1992
KR 10-2001-0010423 3/2007

OTHER PUBLICATIONS

Stanley Wolf Ph.D., Silicon Processing for the VLSI Era, 1990, p. 318, VO. 2, Lattice Press, Sunset Beach, CA, U.S.A.

(Continued)

*Primary Examiner*—Michelle Estrada

(57) ABSTRACT

A method of manufacture for semiconductor electronic products and a circuit structure. A semiconductor material has a surface region and dopant is provided to a portion of the surface region. The portion of the surface region provided with the dopant is irradiated with sufficient energy to induce diffusion of the dopant from the portion of the surface region to another region of the semiconductor material.

A method for manufacturing an electronic product with a semiconductor material having a surface and two spaced-apart regions along the surface for receiving dopant includes forming a field effect transistor gate structure is along the surface and over a third region of the surface between the two spaced-apart regions. Dopant is provided to the spaced-apart regions which are heated to a temperature at least 50 degrees C. higher than the peak temperature which results in the third region when the spaced-apart regions are heated.

A circuit comprises a semiconductor material having a surface region for formation of devices, a field effect transistor gate structure formed on the surface region, the gate structure including a conductive layer and an amorphous insulative layer having a dielectric constant greater than five relative to free space. The insulative layer is formed between the conductive layer and the surface region. A source region is formed along the surface region and a drain region is also formed along the surface region. The gate structure, source region and drain region are configured to form an operable field effect transistor.

16 Claims, 3 Drawing Sheets

U.S. PATENT DOCUMENTS

| | | | |
|---|---|---|---|
| 4,026,733 A * | 5/1977 | Owen et al. | 438/301 |
| 4,259,366 A | 3/1981 | Balasubramanian et al. | |
| 4,400,715 A * | 8/1983 | Barbee et al. | 257/74 |
| 4,468,855 A | 9/1984 | Sasaki | |
| 4,509,991 A | 4/1985 | Taur | |
| 4,539,743 A * | 9/1985 | Anthony et al. | 438/23 |
| 4,589,056 A | 5/1986 | Stimmell | |
| 4,792,925 A | 12/1988 | Corda et al. | |
| 5,021,851 A * | 6/1991 | Haken et al. | 257/332 |
| 5,057,898 A | 10/1991 | Adan et al. | |
| 5,098,861 A * | 3/1992 | Blackstone | 438/406 |
| 5,185,278 A | 2/1993 | Barker | |
| 5,292,673 A | 3/1994 | Shinriki et al. | |
| 5,308,997 A | 5/1994 | Cooper et al. | |
| 5,418,393 A | 5/1995 | Hayden | |
| 5,434,438 A | 7/1995 | Kuo | |
| 5,596,214 A | 1/1997 | Endo | |
| H1637 H | 3/1997 | Offord | |
| 5,631,176 A * | 5/1997 | Kapoor | 438/195 |
| 5,696,011 A | 12/1997 | Yamazaki et al. | |
| 5,780,892 A | 7/1998 | Chen | |
| 5,849,639 A | 12/1998 | Molloy et al. | |
| 5,953,615 A | 9/1999 | Yu | |
| 5,956,603 A | 9/1999 | Talwar et al. | |
| 6,008,101 A | 12/1999 | Tanaka | |
| 6,121,098 A * | 9/2000 | Strobl | 438/301 |
| 6,194,748 B1 | 2/2001 | Yu | |
| 6,291,302 B1 * | 9/2001 | Yu | 438/305 |
| 6,388,298 B1 | 5/2002 | Gardner et al. | |
| 6,395,624 B1 * | 5/2002 | Bruce et al. | 438/535 |

OTHER PUBLICATIONS

Tsukamoto H. et al., "Selective Laser Annealing (SELA) Used in the Fabrication of sub-0.1 muM MOSFETs"; Solid State Electronics, Elsevier Science Publishers, Barking, GB; vol. 42, No. 4; Apr. 1, 1998; pp. 547-556.

Fowler A.B. et al.; "Selective Laser Annealing Through Quarter- and Half-Wave Coatings"; IBM Technical Disclosure Bulletin, IBM Corp. New York, US; vol. 22, No. 12; May 1980; pp. 5473-5474.

Partial European Search Report; 5 pages.

Autran J-L, et al., "Fabrication and Characterization of SI-MOSFET'S with PECVD Amorphous $Ta_2O_5$ Gate Insulator", Sep. 1, 1997, pp. 447-449, vol. 18, No. 9 IEEE, New York, US.

Chaneliere C, et al., "Tantalum Pentoxide ($Ta_2O_5$) Thin Films for Advanced Dielectric Applications", May 25, 1998, pp. 269-322, vol. 22, No. 6, Materials Science and Engineering R: Reports, Elsevier Sequoia S.A., Laussane, CH.

* cited by examiner

SELECTIVE LASER ANNEALING OF SEMICONDUCTOR MATERIAL

RELATED APPLICATIONS

This application is a divisional of application Ser. No. 09/516,004 filed Feb. 29, 2000, now abandoned which is related to the following copending applications: Ser. No. 08/995,435, filed Sep. 22, 1997; Ser. No. 08/995,589 filed Dec. 22, 1997; Ser. No. 09/209,878 filed Dec. 11, 1998; and Ser. No. 09/339,895, filed Jun. 25, 1999, all of which are incorporated herein by reference.

FIELD OF THE INVENTION

This invention relates to temperature-constrained processing of semiconductor materials and, more particularly, to aspects of electronic component manufacture which involve annealing the semiconductor material.

BACKGROUND OF THE INVENTION

Modern day semiconductor electronic devices include power transistor devices and integrated circuit devices comprising many transistors formed on a small section of semiconductor material. It is common for thousands of such devices to be simultaneously formed on a single wafer of crystalline semiconductor material. Advances in semiconductor processing have enabled volume manufacture of such electronic devices having feature sizes less than 0.25 micron, and there is progress toward geometries below 0.10 micron.

All transistors operate based on the presence of impurities, commonly referred to as dopants, placed in the lattice structure of the semiconductor material. By varying the concentration of dopants in select regions of the semiconductor crystal lattice one can alter the conductivity and other electrical characteristics of the transistor. For example, the voltage at which a transistor begins to switch into a conducting state, as well as the on-off switching speed of the transistor, may depend in part on the presence of predefined dopant concentration profiles in critical regions of the semiconductor material.

For conventional silicon transistors having sub-micron feature sizes these requirements are typically met through multiple high energy implantations of various dopant ions into the surface of the semiconductor wafer, followed by temperature cycling of the wafer. That is, multiple heat treatments are relied upon to thermally diffuse the implanted dopants until desired dopant profiles are attained in or near the transistor regions of the semiconductor material.

Such diffusions are commonly achieved by thermal annealing of the semiconductor wafer. While it is typically a goal of dopant diffusion to drive the dopant deeper into the semiconductor material (relative to the surface), and there is little ability to control the direction of diffusion, the dopant moves in a lateral direction (along the surface) as well. Conventionally, the distances dopants travel from an implant region are controlled by the time and temperature profile of the thermal diffusion cycle.

By controlling the energy and dose of the ion implant as well as the profile of the thermal diffusion cycle, a desired depth of diffusion can be attained without exceeding the maximum tolerable lateral diffusion. Nonetheless, the inherent features of thermal diffusion impose limitations on spacings between device features, e.g., the source, gate and drain regions of a lateral metal oxide silicon field effect transistor (MOSFET). This is particularly true as lateral device geometries progress below 0.2 micron.

The lateral geometry constraints due to diffusion have been addressed by designing shallow junction depths and by performing relatively brief thermal treatments commonly referred to as the rapid thermal anneal (RTA) or rapid thermal diffusion (RTD) in which the temperature of a wafer is rapidly cycled to a peak value, held at the maximum temperature for a short period and then quickly cooled.

An additional challenge relative to reduced geometries is the greater sensitivity to high temperature processing of certain materials preferred for manufacturing high speed circuitry with smaller than 0.20 micron feature sizes. These materials include conductors and dielectrics which help sustain or improve the speed and integrity of transistor devices as device layers become thinner and lateral geometries continue to shrink. Generally, as devices shrink the thermal budget becomes more restricted.

Further, the entire manufacturing process must be designed to account for the effect each temperature cycle has on the materials subjected to the heat treatment. In many instances the sequence of manufacturing steps is constrained to avoid subjecting certain materials to undesirable temperatures. At times this leads to complex and costly process steps. For example, it has been proposed that the high temperature anneal of source/drain regions in a MOSFET (which effect dopant diffusion) precede (rather than follow) the formation of the gate dielectric. While this would enable incorporation of a temperature-sensitive but preferred dielectric material, it renders alignment of the source/drain regions about the gate structure a more complex process.

SUMMARY OF THE INVENTION

To overcome limitations associated with low-temperature requirements in semiconductor processing novel methods of manufacture are now presented as well as novel structures which result therefrom.

A method of manufacture includes providing a semiconductor material having a surface region and providing dopant to a portion of the surface region. The portion of the surface region provided with the dopant is irradiated with sufficient energy to induce diffusion of the dopant from the portion of the surface region to another region of the semiconductor material.

The present invention also provides a method for manufacturing an electronic product with a semiconductor material having a surface and two spaced-apart regions along the surface for receiving dopant. A field effect transistor gate structure is formed along the surface and over a third region of the surface between the two spaced-apart regions and dopant is provided to the spaced-apart regions. The spaced-apart regions are heated by applying radiation of a wavelength which is capable of being absorbed by the spaced-apart regions and reflected by a portion of the gate structure. In one embodiment of the invention a field effect transistor gate structure is formed along the surface and over a third region of the surface between the two spaced-apart regions and dopant is provided to the spaced-apart regions which are heated with laser radiation. In another embodiment of the invention a field effect transistor gate structure is formed along the surface and over a third region of the surface between the two spaced-apart regions and dopant is provided to the spaced-apart regions which are heated to a temperature at least 50 degrees C. higher than the peak temperature which results in the third region when the spaced-apart regions are heated.

A method for controlling movement of a dopant species in a semiconductor material includes providing semiconductor material having a plurality of adjoining regions with a surface for formation of electronic devices, introducing the dopant species along the surface of a first of the regions of the semiconductor material and elevating the temperature of the first region of the semiconductor material relative to the temperature of a surrounding region of the semiconductor material such that the dopant diffuses within at least a portion of the first region.

In another method for manufacturing a semiconductor electronic product there is provided a semiconductor material having a surface region with a layer of $SiO_2$ formed thereon and a layer comprising a metal also formed thereon. Dopant is provided to a portion of the surface region and the surface region is irradiated so that the portion of the surface region containing the dopant absorbs sufficient radiation to diffuse the dopant into another portion of the semiconductor material while at least one of the layers formed on the surface region reflects radiation.

According to the invention an integrated circuit comprises a semiconductor material having a surface region for formation of devices, a field effect transistor gate structure formed on the surface region, the gate structure including a conductive layer and an amorphous insulative layer having a dielectric constant greater than five relative to free space. The insulative layer is formed between the conductive layer and the surface region. A source region is formed along the surface region and a drain region is also formed along the surface region. The gate structure, source region and drain region are configured to form an operable field effect transistor.

In still another embodiment of the invention a semiconductor device includes a semiconductor material of a first conductivity type having a surface region for formation of devices; a field effect transistor gate structure formed on the surface region, a source region and a drain region. The gate structure includes a conductive layer and an insulative layer having a dielectric constant greater than 5 relative to free space. The insulative layer is formed between the conductive layer and the surface region. The source region and the drain region are each formed in the surface region and self aligned with respect to the gate structure, each on a different side of the gate structure. The gate structure, source region and drain region are configured to form a field effect transistor characterized by a gate leakage current less than 0.1 amp per $cm^{-2}$ during operation.

BRIEF DESCRIPTION OF THE DRAWINGS

The invention is best understood from the following detailed description when read in conjunction with the accompanying figure. In accordance with common practice the various described features are not drawn to scale, but are drawn to emphasize specific features relevant to the invention.

Like numbers denote like elements throughout the figures and text.

DETAILED DESCRIPTION OF THE INVENTION

Figure 1:
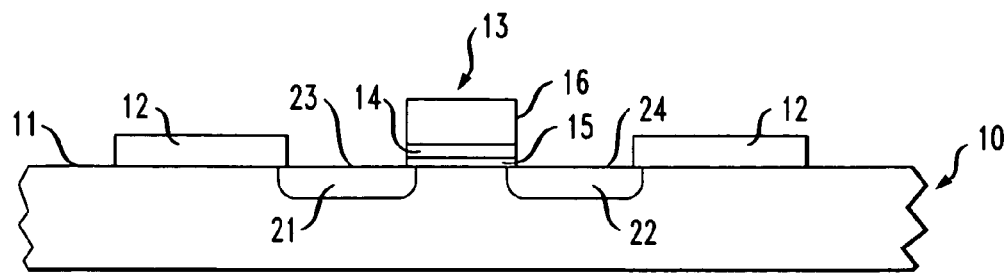
FIG. 1 illustrates a portion of a semiconductor wafer during fabrication of an integrated circuit device.

While the invention is now described in the context of annealing the source/drain regions in the manufacture of MOSFET devices, it should be recognized that this is only an exemplary utilization of the inventive methodology for selectively treating portions of the semiconductor material on a wafer with heat. With reference to FIG. 1 there is shown a portion of a monocrystalline semiconductor wafer substrate 10 having a surface 11 for integrated circuit device formation. The wafer substrate 10 may include epitaxially grown semiconductor material.

Application of the invention is now illustrated for a transistor device formed along the surface 11. Two regions comprising field dielectric 12 are shown formed on this portion of the substrate. Typically the substrate 10 is silicon, but may be formed with one or a combination of semiconductor materials including but not limited to Si, Ge, GaAs, AlGaAs, InGaAs or other III-V compounds.

The invention is now described with the substrate 10 formed of silicon and the field dielectric 12 comprising silicon dioxide ($SiO_2$), formed by local oxidation or commonly known shallow trench isolation techniques. A field effect transistor (FET) gate structure 13 is formed over the substrate 10. An amorphous tantalum pentoxide ($Ta_2O_5$) dielectric layer 14 is formed with a $SiO_2$ dielectric layer 15 interposed between the layer 14 and the substrate 10. A gate electrode 16 overlays the dielectric layers 14 and 15. Numerous techniques are available to form the gate structure with a layer of insulator having a high dielectric constant such as provided by amorphous $Ta_2O_5$. For example, the electrode 16 may comprise tungsten silicide formed over a tungsten silicon nitride barrier layer which barrier layer inhibits oxygen diffusion. This and other variations are described in Ser. No. 09/209,787. Intended source/drain regions 21 and 22 are located in the wafer substrate 10 on opposing sides of the gate structure 13. Surface portion 23 overlies region 21 and surface portion 24 overlies region 22.

In the past gate structures have conventionally been formed with only a $SiO_2$ dielectric. However, the difficulty of providing a thinner, pin-hole free $SiO_2$ gate dielectric and avoiding effects such as tunneling has led to the inclusion of so called "high k" dielectrics such as $Ta_2O_5$, and other oxides including certain ones of titanium, strontium barium and lead. These materials can be formed in device and circuit structures to provide dielectric constants relative to free space greater than 5. That is, these and other oxides will provide a desired high transconductance between the gate metal and the underlying channel region while avoiding the problems inherent with using only $SiO_2$ as the gate dielectric.

Composite dielectrics and electrodes which are compositionally graded overcome problems caused by interlayer stresses. See again Ser. No. 09/209,787. The $SiO_2$ dielectric layer 15 is desirable but not always necessary in order to improve the interface between the underlying silicon and the overlying $Ta_2O_5$ dielectric layer 14.

As is common to current semiconductor processing the source/drain regions 21 and 22 are self-aligned with respect to the gate structure 13. That is, after gate formation they are formed by ion implantation of dopant material into portions of the wafer surface 11 overlying the regions 21 and 22, i.e., on opposing sides of the gate structure 13. Other techniques for providing dopant to the regions 21 and 22 may be used as well. Conventionally there is an implantation followed by an anneal at about 1000C to achieve a desired diffusion profile (not shown).

The present invention addresses the problem which arises when the gate dielectric comprises material having thermally sensitive properties. For example, $Ta_2O_5$ changes from an amorphous state to a polycrystalline state at temperatures in the range required for annealing the source/drain regions 21 and 22. In the polycrystalline form $Ta_2O_5$ has a lower dielectric constant than that of the amorphous form and when used as a gate dielectric results in significant leakage current from the gate structure, i.e., on the order of one amp per $cm^{-2}$ during transistor operation.

According to the invention a spatially selective anneal is effected with radiation. In the preferred embodiment portions 23 and 24 of the wafer surface 11 overlying the intended source/drain regions 21 and 22 are selectively irradiated to heat certain exposed regions including the source/drain regions 21 and 22. The radiation elevates the temperature of the intended source/drain regions to such temperature as will allow diffusion of the implanted dopant to desired locations. At the same time, the temperatures of other wafer regions adjoining the regions 21 or 22 may become elevated due to thermal dissipation, but according to the invention are not elevated to sufficient peak level or for sufficient time duration as to permit electrically significant amounts of the dopant to diffuse from a desired region 21 or 22 to an undesired adjoining region. As used herein the term "electrically significant amounts" means amounts which would noticeably influence electrical characteristics of an associated transistor device.

Thus irradiation of the surface portions 23 and 24 with select wavelength(s), power and total energy dose permits a level of control over the dopant diffusion not previously attainable. Advantageously, because the temperature elevation is made local to the intended source/drain regions, the $Ta_2O_5$ dielectric layer 14 is not elevated to such temperature which causes a change from the desired amorphous state. The activation of dopants with this technique provides a more controlled diffusion (e.g., relative to RTA) and conforms with temperature processing constraints. The resulting structure exhibits significantly reduced leakage current from the gate structure 13 relative to that associated with conventional high temperature processing of the source/drain diffusions. The leakage current is easily reduced by at least an order of magnitude, e.g., from one amp per $cm^{-2}$ to 0.1 amp per $cm^{-2}$ or 10 milliamps per $cm^{-2}$. Leakage currents at or below one milliamp per $cm^{-2}$ are achievable when the temperature of the $Ta_2O_5$ is kept below the threshold at which it would transition out of the amorphous state.

More generally, the spatially selective anneal provides a distinct temperature differential between adjacent regions on the wafer 10. The differential may be relatively small, e.g., less than 50 degrees C., or may be relatively large, e.g., far in excess of 300 degrees C. For example, the layer 14 of $Ta_2O_5$ will not exceed 600 C when the nearby source/drain regions are heated in excess of 1000 C. The temperature differentials are selective across the wafer material, whereas in a conventional anneal, e.g., a RTA, there is no ability to introduce useful temperature differentials because the entire wafer is subjected to the anneal.

The preferred radiation source for elevating the temperature of the source/drain regions is a Q-switched excimer laser which emits radiation at a wavelength at or near an absorption peak of silicon, e.g., 308 nm. The radiation wavelength may be selected to also be non-absorptive when incident upon other materials formed on the wafer substrate so that substantially smaller or no temperature elevations occur in regions where higher temperatures could degrade materials properties or device performance. Alternately a reflective shield layer could be deposited on regions where the radiation should not be absorbed; or a mask could be used to prevent the laser energy from striking regions on the substrate other than desired locations such as the source/drain regions 21 and 22.

Although the surface portions 23 and 24 are illustrated as occupying regions extending from the field dielectric 12 to the gate structure 13, neither the dopant implant or the irradiation need be commensurate with these. Rather, the implantation could penetrate a smaller surface region to further minimize lateral diffusion, and the irradiation could define source/drain regions of smaller or greater lateral dimension, i.e., along the surface 11, including drain extensions. The depth of the diffusion is controlled by varying the wavelength, power and duration of the selective irradiation.

Figure 2:
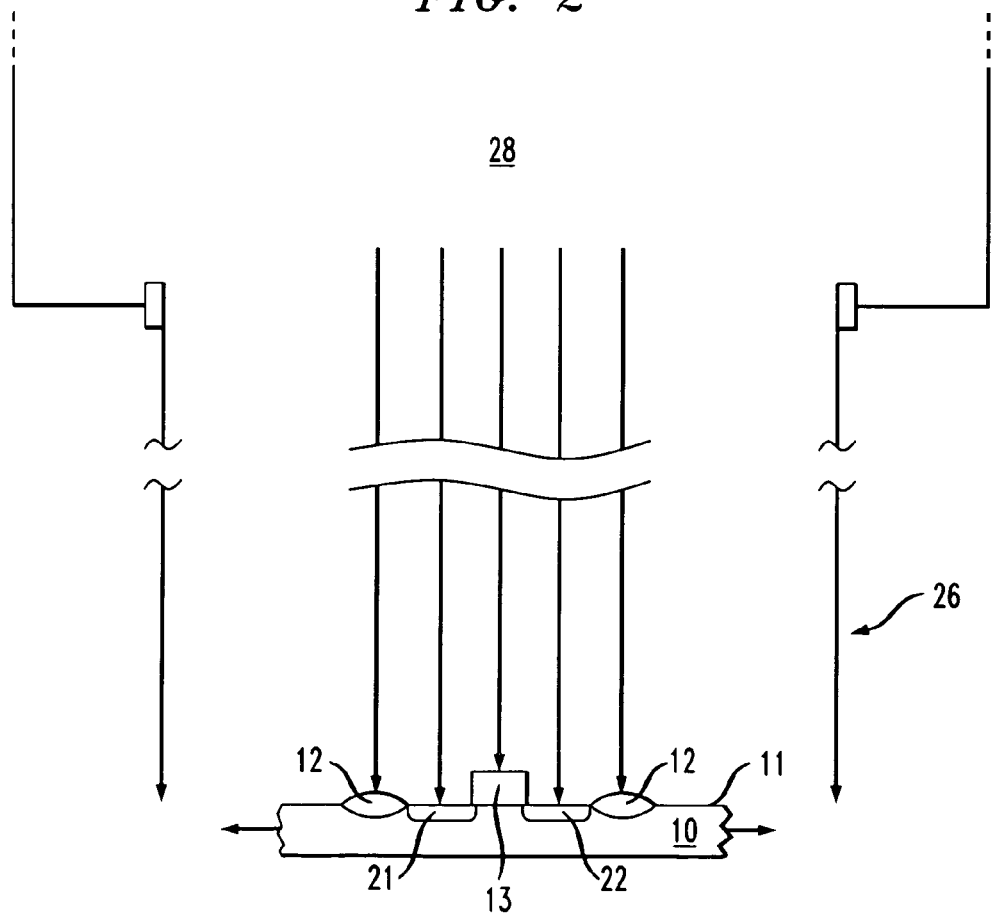
FIG. 2 illustrates radiation impinging on a portion of the surface of a semiconductor wafer according to the invention.

FIG. 2 illustrates (schematically) a narrow beam 26 of radiation generated from a laser source 28 and impinging on a portion of the substrate surface 11 for absorption in the source/drain regions 21 and 22 with reflection by the gate structure 13 and by the field dielectric regions 12. The gate electrode and other conductive portions along the wafer surface will typically comprise a reflective silicide or other metal. Thus in numerous applications of the concepts disclosed herein there is no need for additional masking to prevent radiation from impinging on regions or layers which are heat sensitive.

The width of the beam 26 could span the entire diameter or a portion of the diameter of the wafer substrate 10. Alternately it could be relatively narrow, e.g., on the order of a device feature size, and scanned in a raster pattern. The raster pattern can be programmed to skip portions of the wafer, or the laser can be switched in conjunction with the scan to selectively irradiate portions of the wafer.

Figure 3:
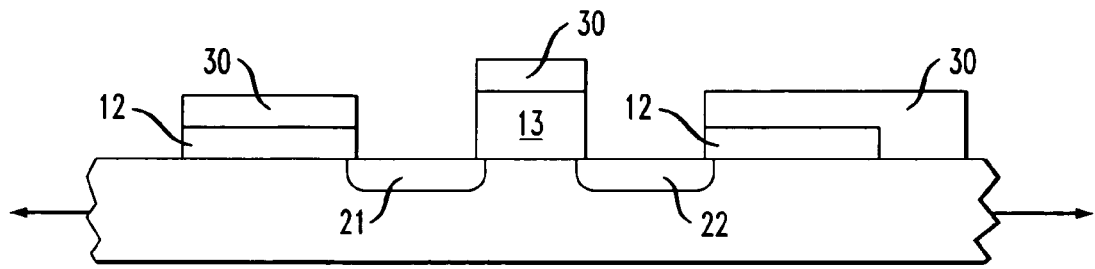
FIG. 3 illustrates formation of a reflective layer according to one embodiment of the invention.

FIG. 3 illustrates a deposited and patterned reflective layer 30 over a portion of the substrate 11 to expose only desired regions for absorption of radiation 26 from the source 28 of FIG. 2. Other regions are shielded by the reflective layer to prevent or limit temperature elevation. The reflective layer 30 may be chosen based on a desired characteristic for reflecting the same wavelength of laser radiation which is absorbed by the semiconductor substrate material, e.g., silicon. The layer 30 could be a deposited oxide formed from decomposition of tetraethyl orthosilicate (TEOS) by chemical vapor deposition (CVD) or plasma-enhanced chemical vapor deposition (PECVD), or could be silicon nitride. This reflective layer could be formed with standard pattern and etch photoresist techniques. Alternately, some forms of photoresist may have the required reflective properties such that they alone may be patterned to provide the reflective layer 30.

Although FIG. 3 illustrates patterning of the reflective area to expose the surface portions 23 and 24 to simultaneously activate dopant in both of the intended source/drain regions 21 and 21, a different reflective layer could be deposited to separately activate the intended source/drain regions, this providing a different diffusion profile for each. The first reflective layer could be patterned to cover the surface portion 23 while leaving the surface portion 24 exposed to receive radiation; and the second the reflective layer could be patterned to cover the surface portion 24 while leaving the surface portion 23 exposed to receive radiation. The same concept applies to complementary integrated circuit devices wherein one may separately diffuse dopant associated with diffusions, e.g., source/drain regions, for devices of different conductivity types or different types of devices being formed on the same integrated circuit. This approach is useful for diffusions in bipolar and field effect transistor devices as well as passive devices.

Figure 4:
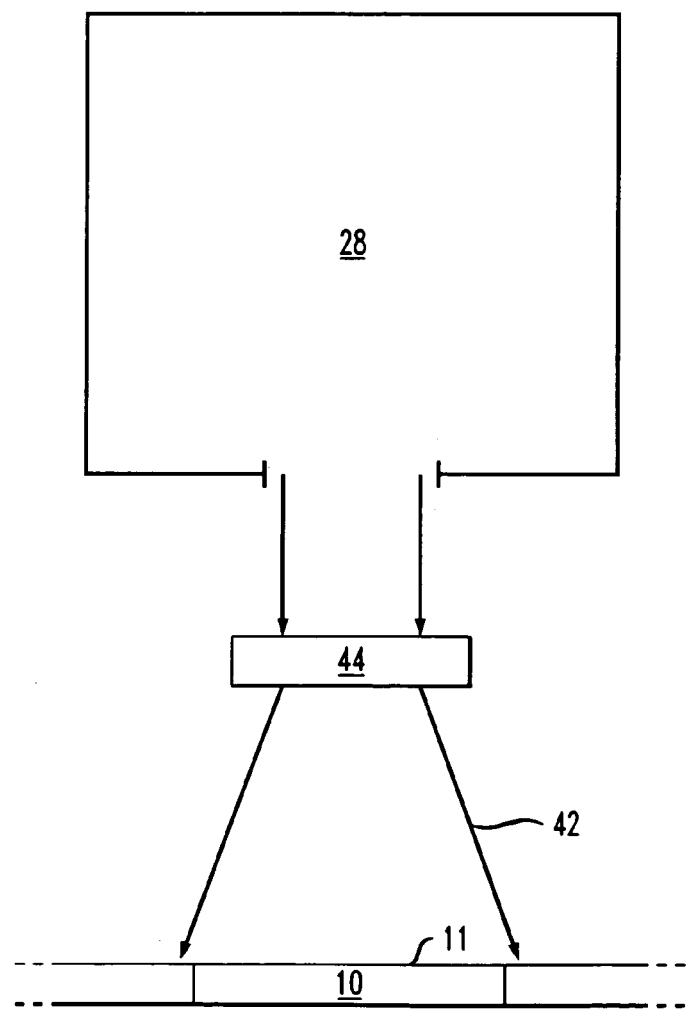
FIG. 4 illustrates positioning of a mask in conjunction with a laser source according to one embodiment of the invention.

FIG. 4 illustrates positioning of a mask 40 between a laser source 28 and the wafer substrate 10 (comprising a large number of integrated circuit devices). A wide radiation beam 42 is transmitted to desired portions of the substrate surface 11 across the wafer 10 while blocking other portions of the beam from striking other portions the wafer substrate 10. The mask 40 is patterned to provide portions which transmit radiation from the beam 26 while other portions absorb or reflect the radiation. An optional optical system 44 is shown (in block diagram form) to provide the ability to modify the width of the beam 26. With this approach, multiple source/drain regions 21 and 22 on multiple integrated circuit devices may be simultaneously annealed.

Based on experiments it has been determined that a laser anneal according to the invention will activate an As dose of $3 \times 10\ 15\ cm^{-2}$ (implanted at 50 KeV) to provide a peak concentration on the order of $4 \times 10\ 20\ cm^{-3}$. For a CMOS device the resulting source/drain regions can have a sheet resistance as low as 65 ohms per square. With an excimer laser having pulse durations of 35 ns and pulse energies of 600-700 millijoules per pulse, the laser can provide approximately 700 to 1000 nanojoules/cm². The resulting profile can be achieved with approximately ten pulses. More generally the irradiation could range from 100 to 2000 or more nanojoules/cm².

Another feature of the invention is that the laser radiation can alter the mechanism for dopant diffusion. By melting the crystal lattice the dopant migrates by diffusion through a liquid. Depending in part on solubility of the dopant species in the liquid phase of the semiconductor material, it is now possible to distribute the species at a different rate and over a more limited volume than was attainable with a conventional thermal anneal. This provides greater control in the depth and width of the diffusion profile relative to the surface 11. Thus for a source/drain region it is now possible to control the dopant distribution by modifying the physical state in a small portion the semiconductor material. The lateral diffusion, i.e., along the surface 11, may be so limited, e.g., by controlling the radiation beam width, to enable further reduction in space requirements for transistor devices. The depth of dopant penetration can be controlled based on selection of one or multiple radiation wavelengths, power, pulse train definition and total energy dose.

The inventive method is useful for a variety of heat treatments where it is desirable to selectively heat discrete portions of the substrate surface 11 or other portions of an integrated circuit. For example, it may be desirable to perform dopant implantations or diffusions in stages of the manufacturing process when heat treatment by RTA would be inconsistent with constraints associated with other diffusions or materials properties. With a deposit and patterning of resist, for example, it is possible to selectively implant a region and then activate the dopant through selective irradiation. See FIG. 5 which illustrates the wafer 10 in a subsequent phase of manufacture. Source/drain vias 50 and gate electrode via 51 have been formed through a dielectric layer 54 for making ohmic contact with each source/drain region 21 and 22 and the gate structure 13.

Metallization involves conventional formation of a Ti layer 58 followed by a TiN layer 60. Although not illustrated, in the vias 50 portions of the Ti from layer 58 react to form TiSi2, which improves the ohmic contact. However, the etch process by which the vias 50 have been formed is known at times to result in undesirable removal of semiconductor material from those subregions of the source/drain regions which make direct contact with the Ti layer 58. This as well as the loss of semiconductor material by formation of silicide at the interface can reduce the effective depth of the source/drain regions to an unacceptable level. The effects become more significant to manufacture as device geometries and junction depths shrink.

It would be desirable to replenish the dopant species through the source/drain vias 50. In the past this was not possible due to the thermal limitations imposed after via formation. According to the invention dopant species can be provided through the vias by implantation, outdiffusion, chemical reaction with plasma components, or other means of placing dopant material along the exposed semiconductor material in the vias 50. A selective anneal can be effected through the source/drain vias with radiation as has been described above for the source/drain regions 21 and 22; except that the dielectric layer 54 serves as a mask to anneal portions of the source drain regions in alignment with the vias. This prevents heating of adjacent regions on the wafer 10 so that primarily the regions affected by window washing are modified. The radiation can be absorbed by the dielectric layer 54; or the wavelength may be selected so thqat the incident radiation reflects from the dielectric layer; or a layer reflective to the chosen wavelength can be deposited over the dielectric layer. The selective irradiation results in diffusion of additional dopant about only the portions of the source/drain regions open to the vias with no significant diffusion elsewhere in the source/drain regions. More generally, an opening in a layer of dielectric, photoresist or other material can be used for insertion and selective anneal of dopant according to the above teachings.

Figure 5:
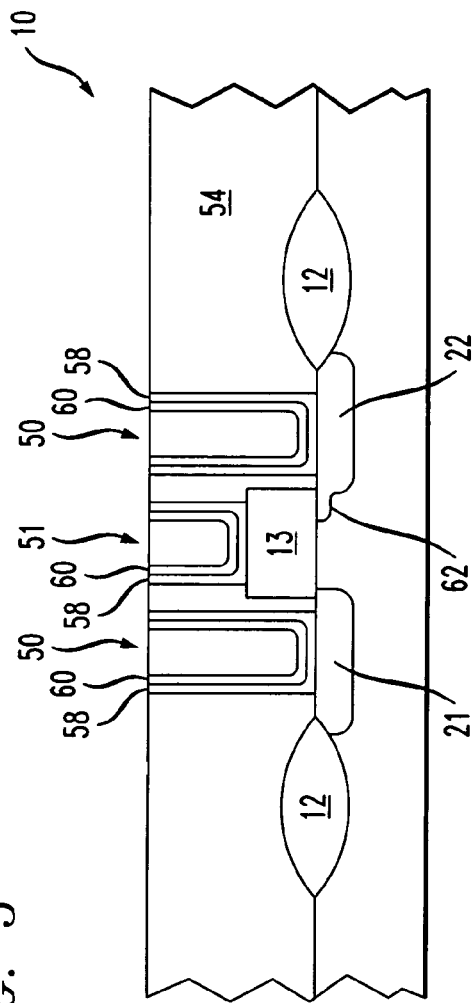
FIG. 5 illustrates the wafer of FIG. 1 during a subsequent phase of manufacture.

In the view of FIG. 5 the drain region is illustrated as including a drain extension 62. In the past such extensions have been symmetrically formed with the source regions due to process limitations. With the ability to selectively implant and selectively anneal the region in which the drain extension is formed it is possible to provide lower sheet resistance between the gate channel and the drain region, while retaining a higher resistance between the source region and the gate channel. The anneal for the drain extension can be made through a mask or a patterned opening.

Figure 6:
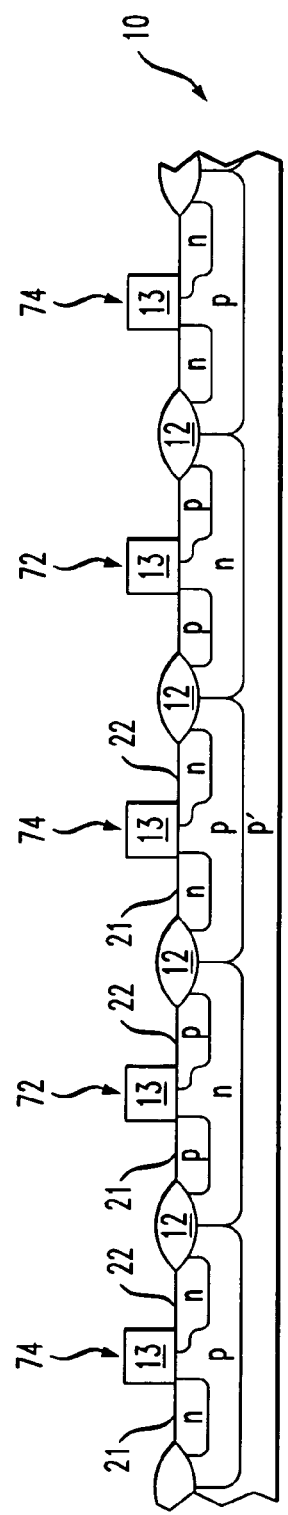
FIG. 6 illustrates in partial view an integrated circuit device in a stage of fabrication.

The invention has been described in detail for an integrated circuit device. Such a device 70 is illustrated in the partial view of the wafer 10 presented in FIG. 6. A portion of the device 70 is shown to comprise pairs of complementary field effect transistors 72 and 74 i.e., n-channel transistors 72 an p-channel transistors 74. The device 70 of FIG. 6 is illustrated in a stage of fabrication similar to the stage of fabrication illustrated in FIG. 1.

The concepts disclosed herein may be applied to diffusion of dopant species to create regions in bipolar transistor devices as well. For example, formation of abrupt diffusions can be readily effected in epitaxially grown base regions. The disclosed concepts can be applied to render collector regions of small geometry to improve the packing density of bipolar devices.

It should also be noted that the disclosed concepts may be applied in a variety of other product types including those incorporating complementary bipolar devices and devices formed with compound semiconductor materials. The invention enables formation or improves performance of systems on a chip wherein a variety of technology modules may be integrated. In the past such integration has been limited in part by incompatibilities or cost restrictions associated with manufacturing requirements of the individual technologies.

Technologies which may be combined using the present invention include analog and digital CMOS, analog and digital bipolar, rf circuitry, embedded memory (DRAM, SRAM, FLASH memory) and silicon-on-insulator.

The invention has been described with regard to only a few illustrative embodiments while the principles disclosed herein provide a basis for practicing the invention in a variety of ways on a variety of semiconductor structures. Other constructions, although not expressly described herein, do not depart from the scope of the invention which is only limited by the claims which follow.

What is claimed is:

1. A method for manufacturing an electronic product including a field effect transistor, comprising:
    providing semiconductor material of a first conductivity type having a surface and two spaced-apart regions along the surface for receiving dopant of a second conductivity type;
    forming a field effect transistor gate structure along the surface and over a third region of the surface between the two spaced apart regions;
    providing dopant to the spaced-apart regions; and
    spatially selectively heating the spaced apart regions to a temperature at least 50 degrees C. higher than a peak level of temperature which results in the third region when the spaced-apart regions are heated.

2. The method of claim 1 wherein upon heating the spaced-apart regions the dopant diffuses within the spaced-apart regions and electrically significant amounts of the dopant do not diffuse beyond the spaced-apart regions into other portions of the semiconductor material.

3. The method of claim 1 wherein the peak level of temperature of the gate structure resulting from heating the spaced-apart regions does not exceed 700 degrees C.

4. The method of claim 1 wherein the step of spatially selectively heating the spaced-apart regions is effected with a monochromatic laser tuned to 308 nm.

5. The method of claim 4 wherein the spaced-apart regions are heated to a temperature at least 300 degrees C. higher than the peak level of temperature which results in the third region when the spaced-apart regions are heated.

6. A method for manufacturing a semiconductor electronic product comprising:
    providing semiconductor material having a surface region;
    providing dopant to a portion of the surface region;
    irradiating the portion of the surface region with sufficient energy to induce diffusion of the dopant from the portion of the surface region to another region of the semiconductor material, wherein the irradiating elevates the temperature of the portion of the surface region to render the dopant soluble in the semiconductor material.

7. The method of claim 6 wherein the step of irradiating renders the portion of the surface region liquid.

8. The method of claim 6 wherein the step of irradiating renders a portion of the semiconductor material including said portion of the surface region liquid and results in diffusion of the dopant about the liquid portion without electrically significant amounts of the dopant diffusing out of the liquid portion to other portions of the semiconductor material.

9. The method of claim 7 further comprising allowing the liquid to solidify.

10. A method for controlling movement of a dopant species in a semiconductor material comprising:
    providing semiconductor material having a plurality of adjoining regions with a surface for formation of electronic devices;
    introducing the dopant species along the surface of a first of the regions of the semiconductor material;
    elevating the temperature of the first region of the semiconductor material relative to the temperature of a surrounding region of the semiconductor material such that the dopant diffuses within at least a portion of the first region.

11. The method of claim 10 wherein upon elevation of the temperature in the first region the temperature of the surrounding region remains lower than the minimum temperature required to effect thermal diffusion of the dopant species in the surrounding region.

12. The method of claim 10 wherein elevation of the temperature in the first region is of such limited time duration as to preclude diffusion of electrically significant amounts of the dopant species into the surrounding region.

13. A method for manufacturing a semiconductor electronic product comprising:
    providing semiconductor material having a surface region with a layer of $SiO_2$ formed thereon and a layer of metal also formed thereon;
    providing a dopant to a portion of the surface region;
    irradiating the surface region by applying radiation of a wavelength such that the portion of the surface region containing the dopant absorbs sufficient radiation to diffuse the dopant into another portion of the semiconductor material and such that at least one of the layers formed on the surface region reflects said radiation.

14. The method of claim 13 wherein the layer of metal comprises tungsten silicide.

15. A method for manufacturing an electronic product including a field effect transistor, comprising:
    providing semiconductor material of a first conductivity type having a surface and two spaced-apart regions along the surface for receiving dopant of a second conductivity type;
    forming a field effect transistor gate structure along the surface and over a third region of the surface between the two spaced-apart regions;
    providing dopant to the spaced-apart regions;
    spatially selectively heating the spaced-apart regions but not the third region, with laser radiation.

16. A method for manufacturing an electronic product including a field effect transistor, comprising:
    providing semiconductor material of a first conductivity type having a surface and two spaced-apart regions along the surface for receiving dopant of a second conductivity type;
    forming a field effect transistor gate structure along the surface and over a third region of the surface between the two spaced-apart regions;
    providing dopant to the spaced-apart regions;
    spatially selectively heating the spaced-apart regions by applying radiation of a wavelength that is absorbed by the spaced-apart regions and reflected by a portion of the gate structure.

* * * * *